United States Patent
Fernandez et al.

(10) Patent No.: US 8,147,280 B2
(45) Date of Patent: Apr. 3, 2012

(54) BATTERY POST CONNECTOR

(75) Inventors: Jose Gabriel Fernandez, Valls (ES);
Josep M. Roset, Valls (ES); Daniel Soto, Torredembarra (ES)

(73) Assignee: Lear Corporation, Southfield, MI (US)

( * ) Notice: Subject to any disclaimer, the term of this patent is extended or adjusted under 35 U.S.C. 154(b) by 83 days.

(21) Appl. No.: 12/663,210

(22) PCT Filed: Jun. 3, 2008
(Under 37 CFR 1.47)

(86) PCT No.: PCT/US2008/065634
§ 371 (c)(1),
(2), (4) Date: Dec. 4, 2009

(87) PCT Pub. No.: WO2008/151181
PCT Pub. Date: Dec. 11, 2008

(65) Prior Publication Data
US 2011/0076888 A1    Mar. 31, 2011

Related U.S. Application Data

(60) Provisional application No. 60/941,764, filed on Jun. 4, 2007.

(51) Int. Cl.
*H01R 4/28* (2006.01)

(52) U.S. Cl. ...................................................... 439/754
(58) Field of Classification Search .................. 439/754, 439/756–758
See application file for complete search history.

(56) References Cited

U.S. PATENT DOCUMENTS

| 7,405,570 B2 * | 7/2008 | Hirthammer ................. 324/426 |
| 7,500,888 B2 * | 3/2009 | Roset et al. ................... 439/754 |
| 2004/0048142 A1 * | 3/2004 | Marusak et al. ............... 429/61 |
| 2005/0175385 A1 | 8/2005 | Cho et al. |

FOREIGN PATENT DOCUMENTS

| DE | 19924654 A1 | 12/2000 |
| DE | 102004055848 A1 | 5/2006 |
| DE | 102005019922 A1 | 11/2006 |

OTHER PUBLICATIONS

German Office Action for Application No. 10 2008 022 787.0, mailed Mar. 21, 2010, 5 pages.

* cited by examiner

*Primary Examiner* — Truc Nguyen
(74) *Attorney, Agent, or Firm* — Brooks Kushman P.C.

(57) ABSTRACT

A battery monitoring system that may be used to measure/monitor any number of battery operating conditions, including those associated with a vehicle battery. The system may be configured to interconnect a battery post that receives energy from the battery and a cable that electrically connects the battery to a vehicle.

20 Claims, 4 Drawing Sheets

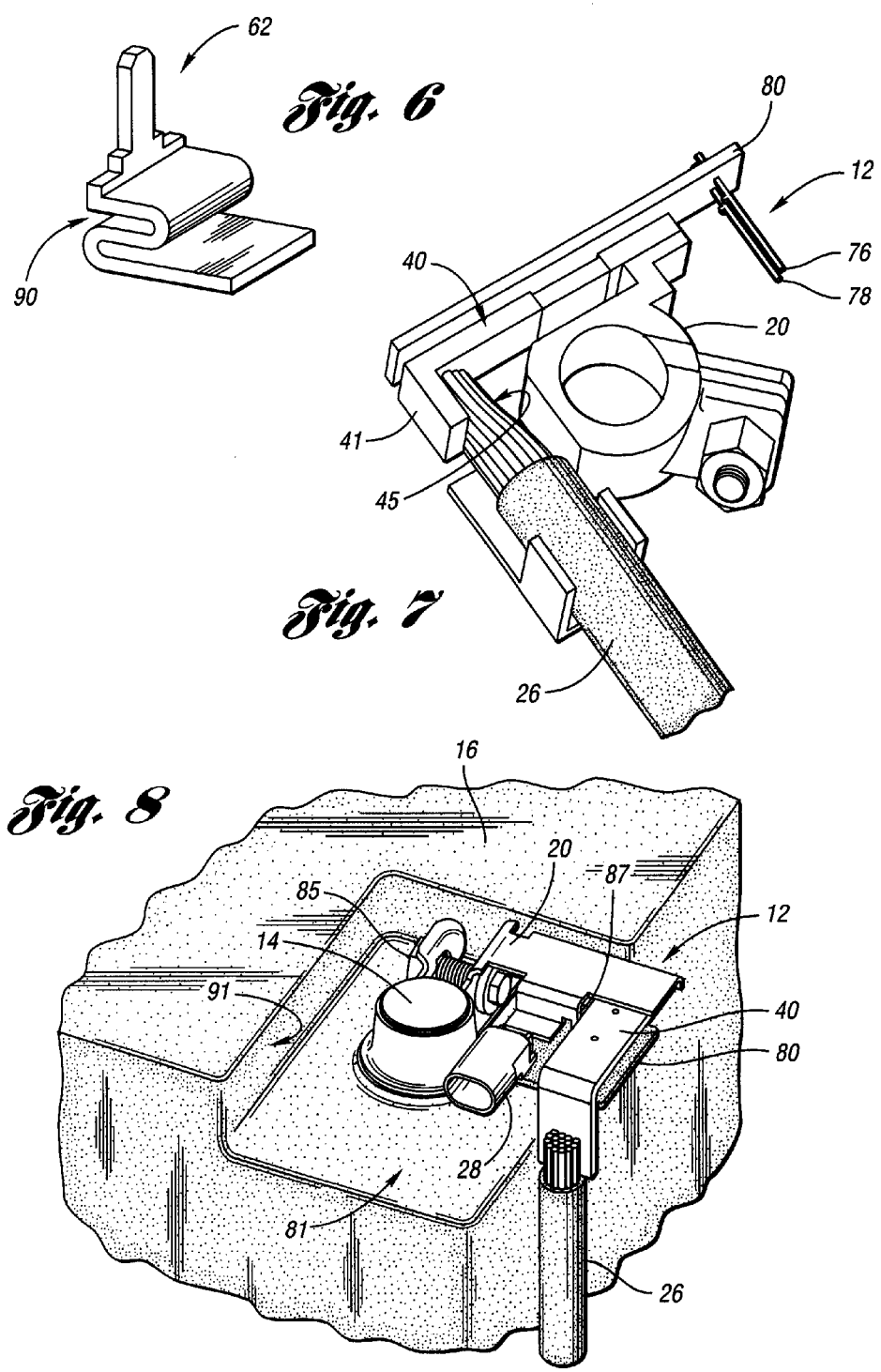

BATTERY POST CONNECTOR

CROSS-REFERENCE TO RELATED APPLICATION

This application claims the benefit of U.S. provisional application Ser. No. 60/941,764 filed Jun. 4, 2007.

BACKGROUND OF THE INVENTION

1. Field of the Invention

The present invention relates to battery post connectors, such as but not limited to the type having capabilities for sensing and/or reporting battery operating conditions.

2. Background Art

Hybrid and non-hybrid vehicles may be equipped with energy storage devices, such as batteries for powering the vehicle and other devices. A battery post connector may be connected to a battery post and configured to sense battery operating conditions. These type of connectors may be employed in automotive vehicles having lead-acid or some other type of battery or similar energy storage device. The connectors may be advantageous in reporting the battery operating conditions to a junction box or other vehicle system controller.

As one skilled in the art will appreciate, automotive vehicles and vehicles having batteries may experience any number of forces during operation and manipulation. These forces may induce vibrations, that in some cases, can disrupt the electrical connection between the battery and battery post connector or the internal electrical connections of the battery post connector in such a manner as to influence the ability of the battery post connector to accurately sense and report the various operating conditions of the battery. The inability or questionable ability of the connector to accurately sense and report the operating characteristics can be problematic.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

FIG. 6 illustrates a connection pin in accordance with one non-limiting aspect of the present invention;

FIG. 7 illustrates a bent shunt in accordance with one non-limiting aspect of the present invention;

FIGS. 8-10 illustrate a stamped terminal adapter in accordance with one non-limiting aspect of the present invention;

DETAILED DESCRIPTION OF THE PREFERRED EMBODIMENT(S)

Figure 1:
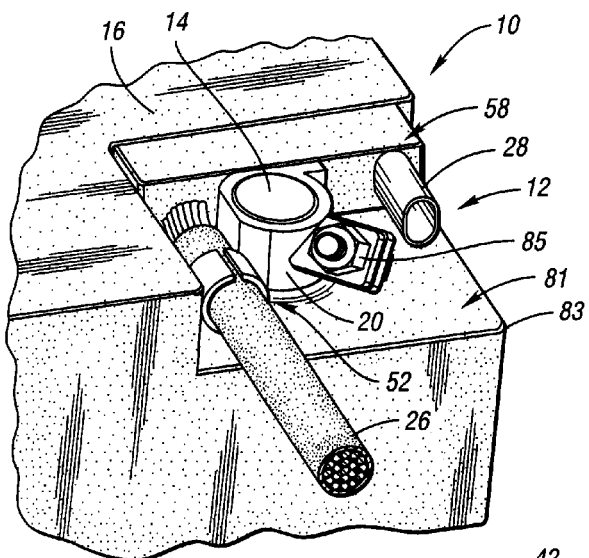
FIG. 1 illustrates a battery post connector system in accordance with one non-limiting aspect of the present invention.

FIG. 1 illustrates a battery post connector system 10 in accordance with one non-limiting aspect of the present invention. A connector 12 may be included and configured for connecting to a battery post 14 of a battery 16, such as but not limited to a lead-acid or other battery commonly employed within vehicles. The connector 12 may be securely connected to the battery post 14 with compressive tightening of a terminal adapter 20 or through another suitable connection. The connector 12 may be configured or otherwise programmed to support any number of connector operations, such as but not limited to measuring/sensing current, voltage, and temperatures associated with the battery 16.

The clamping terminal 20 may comprise a tinned brass or other material suitable for conducting electricity from the battery. The terminal adapter 20, as described below in more detail, may extend relative to the outward clamping end used to connect to the battery post 14. The terminal adapter 20 is configured for attachment to a cylindrical battery post 14 for exemplary purposes and without intending to limit the scope and contemplation of the present invention. Any type of connection to the battery 16 may be used.

The connector 12 may interface with a cable, wire, or other element 26 suitable for conducting electricity to another element within the vehicle, such as but not limited to a vehicle chassis (not shown), grounding element, etc. The vehicle connector 26 may be suitable for use in conducting energy between the battery and a vehicle element. The cable 26 may include an outer insulated portion surrounding a copper or other suitable electrically conducting material.

The connector 12 may further include a network interface 28 for interfacing signals with a network vehicle element (not shown), such as but not limited to a vehicle system controller, junction box, bus, network etc. The network interface 28 may be used to interface any number of signals between the connector 12 and the vehicle system controller or other network vehicle element, i.e., any element not intended to exchange current directly with the battery 16. For example, one or two-way communications may be established with the connector 12 to facilitate any number of operations, such as but not limited operations associated with sensing and measuring current, voltage, temperature, and other operating parameters of the battery 16.

Figure 2:
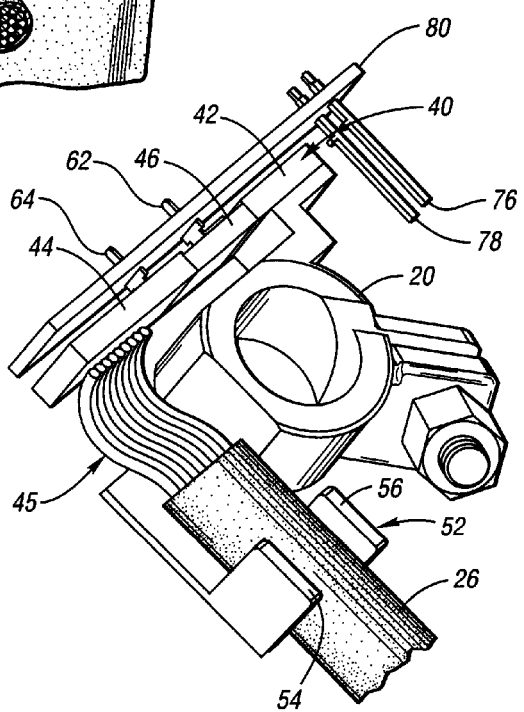
FIG. 2 illustrates a shunt connected to a terminal adapter in accordance with one non-limiting aspect of the present invention.

FIG. 2 illustrates a shunt 40 connected to the terminal adapter 20 in accordance with one non-limiting aspect of the present invention. The shunt 40 may comprise any material have properties sufficient to facilitate electrical connectivity between the terminal adapter 20 and the wire 26. The shunt 40 is shown as a bi-metallic object having copper alloy portions 42-44 and a resistive copper alloy portion 46, such as but not limited to manganin. The copper portions 42-44 correspond with the ends of the shunt 40 and the resistive copper alloy portion 46 may be arranged therebetween such that current must flow from through one copper portion 44, through the resistive copper alloy portion 46, and finally through the other copper 42.

The resistive copper alloy portion 46 may be used as a measuring element suitable for conducting high currents. Sensing features may be included within or outside the boundaries of the resistor copper alloy portion 46 for use in facilitate sensing of a voltage drop therebetween. The known resistive characteristics of the resistor copper alloy 46 may be used in conjunction with the voltage drop to determine current flow through the shunt 40. In this manner, the present invention is able to sense voltage and current associated with the battery 16. The know resistivity of the resistor copper alloy portion 46 can be helpful in assuring the accuracy and consistency of the current calculations. Of course, the present is not intended to be limited to the shunt 40 having the resistive copper alloy portion and fully contemplates the use of any number of other suitable materials, including making the shunt out of a single material/composition, i.e., without the bi-metallic composition.

The shunt 40 may be connected, such as by welding, soldering, or other fastening, to the terminal adapter 20 and at the other end to strands of wires 45 enclosed within an insulating portion of the cable 26. The terminal adapter 20 may be electrically connected at one end to the battery post 14 and at the other end to a non-conducting portion of the vehicle connector 26. A soldering machine or other soldering or welding element may be configured to compress the wires from their circular shape within the cable 26 to a flatter shape more suitable for fastening to the shunt. Once the wires are fastened to the shunt 40, or in the same assembly process the wires may be bent to form the right angle with the shunt 40.

The terminal adapter 20 and the shunt 40 may be connected to the vehicle connector 26 at different portions, i.e., one at a non-conducting portion and the other at a conducting portion. This allows the present invention to exchange current between the vehicle connector 26 and the battery post 14 by way of the shunt 40 and terminal adapter 20, but without any direct electrical connection between the terminal adapter 20 and vehicle connector 26.

The shunt 40 may be welded, soldered, or otherwise attached to the terminal adapter 20 and the vehicle connector 26. These connections can be particularly susceptible to vibrations and other forces associated with vehicle operations. For example, the shunt 40 may be soldered to the wire 26 in order to provide a secure mechanical connection, but at the same time this connection may permit vibrations or other forces associated with the vehicle chassis or other vehicle element to travel up the wire to the connector 12. Similar vibrations may be imparted to the connector 12 such that these and other connector elements, some of which are described below in more detail, may be exposed to various vibrations depending on vehicle operations.

The receptivity of the connector 12 to these and other vibrations can become problematic for the electronic elements, connections, and other features of the connector 12 that are used to perform the various operations associated with determining battery current, voltage, temperatures, etc. Accordingly, one non-limiting aspect of the present invention relates to ameliorating these vibrations and improving the robustness of the connector. A clamp portion 52 at the end of the terminal adapter 20 may be connected to the non-conducting portion of the vehicle connector 26 may be included.

The clamp portion 52 may include opposed fingers 54-56 defining an opening therebetween for receipt of the vehicle connector 26. The clamp portion 52 may be bendable, with a crimp tool or other feature, to compressively connect to the outer portion of the vehicle connector 26. This connection may help reduce vibratory susceptibility of the connector as some or most of the vibration and forces may be directed more towards the terminal adapter 20 as opposed to the shunt 40 and its connections. The terminal adapter 20 directly supports the vibrations and the forces from the vehicle connector 26 by means of the mechanical connection provided between these two elements.

The clamp portion 52 is shown to include the opposed fingers 54-56 for exemplary purposes only. The clamp portion 52 may include any shape or configuration suitable to providing a compressive or other connection between the terminal adapter and the vehicle connector 26. For example, the clamp portion 52 may include a C-shaped configuration where the outer portions of the C-shape are compressed against the vehicle connector 26. Furthermore, the clamp portion 52 may be replaced with a separate piece, such as with a secondary clamp, that may be attached to the terminal adapter 20 after being attached to the connector 26. Such a two-piece construction may ease manufacturing costs and permit use of the terminal adapter with differing sized vehicle connectors 26.

Optionally, to provide insulation between the vehicle connector 26 and the terminal adapter 40, a non-conducting insulator may be included on the vehicle connector 26, as shown. An additional insulator may be used in conjunction therewith or in place thereof. For example, a shrink wrap material may be applied around the vehicle connector 26 and compressed for a snug fit by heating. The wrap may provide insulation to the conducting portion of the vehicle connector 26 and/or additional insulation, such as to cover a gap between where the shunt 40 connects to the conducting portion and where the terminal adapter 20 connects to the non-conducting portion of the vehicle connector 26.

Figure 3:
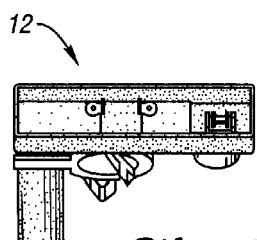
FIG. 3-5 illustrate additional views of the system in accordance with one non-limiting aspect of the present invention.
Figure 4:
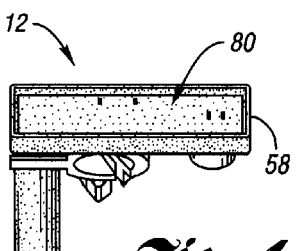
Figure 5:
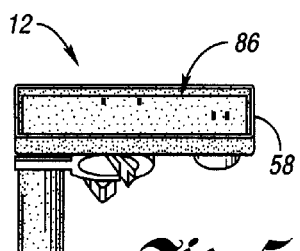

A housing 58 may be included around the shunt 40 and a printed circuit board (PCB) 80 used to assess battery operations. The housing 58 may comprise a non-conducting material configured for covering a portion of the terminal adapter 20 and shunt 40 extending between the battery post 14 and the vehicle connector 26. The housing 58 may be used to electrically isolate the shunt and terminal adapter. FIG. 3 illustrates a rear-side view of the connector 12 with only the shunt 40 included within the housing 58. FIGS. 4-5 respectively illustrate the same view with the inclusion of the PCB 80 and resin potting material 86 within the housing 58.

Connection tabs 62-64 may be welded or otherwise electrically secured to the shunt 40. The tabs 62-64 may include a shoulder or other offset to facilitate offsetting items place over top of the tabs 62-64, i.e., PCB 80. The tabs 62-64 may include footprints extending over a portion of the copper portions of the shunt 40 to facilitate measuring the voltage drop across the manganin portion. The connection tabs 62-64 are shown at a right angle but the present invention fully contemplates the tabs having other configurations, such as but not limited to the s-shaped portion 90 shown in FIG. 6.

The shaped portion 90 may be used to ameliorate strain produced by the thermal and vibratory stress coming from the elements when connected. During use of the connector 12, different temperatures on the components resulting from electrical resistance differences (manganin portion has a resistance ten ways higher than the copper) can produce different elongations on the shunt 40 and the PCB 80, and this strain could damage the connections. The spring effect of the shaped portion 90 can help minimize this effect.

The PCB 80 may include any number of sensors and circuitry to perform any number of logical functions associated with determining the operating conditions of the battery or other operations associated with or based on the connector 12 and its function and performance. For example, the PCB 80 may include a temperature sensor (not shown) for sensing connector temperature and/or battery temperature. A pair of pins 76-78 may be integrated with the housing 58 to facilitate the electrical connection with the network adapter 28.

The temperature sensor may be used to sense the battery temperature as a function of the terminal adapter temperature. This may include establishing a thermal coupler or other element between the terminal adapter and the PCB so as to facilitate temperature sensing. A negative or positive temperature coefficient element may be included proximate the thermal coupler to facilitate sensing the temperature. The PCB 80 is illustrated for exemplary purposes and without intending to limit the scope and contemplation of the present invention. The present invention fully contemplates the use of any type of logically functioning processing element, such as but not limited to a discrete or integrated circuit, having properties sufficient to facilitate determining battery operating conditions, which may or may not be included on a PCB.

The PCB 80 may fit within the sides of the housing 58 for electrical communication with the shunt tabs 62-64 and connector pins 76-78. The PCB 80 may rest on the shoulders of the tabs 62-64 such that a portion of the tabs 62-64 extend through a top side of the PCB 80. The non-conducting resin 86 may be filled in above the PCB 80 and within the side walls of the housing 58 to vibrationally and electrically isolate and waterproof the PCB 80. The resin 86 may be beneficial in to enhancing system integrity against contaminates, water, debris, etc. and/or to facilitate packaging and other component design. The resin 86 may comprise any suitable material and be used to encase the connector features in a waterproof mold. The mold may further enhance the electrical isolation of the PCB 80.

FIG. 7 illustrates the connector 12 having a bent shunt 40 in accordance with one non-limiting aspect of the present invention. The bent shunt 40 may include a bent portion 41 for fastening to the wire portion 45 of the cable 26. FIG. 7 illustrates the connector without the housing 58 for exemplary purposes only and without intending to limit the scope and contemplation of the present invention. The housing 58 may be similarly included with the connector 12 shown in FIG. 1. The bent shunt 40 of FIG. 7 may be limit the stress imparted to the wire portion 45 during bending for the shunt 40 shown in FIG. 2.

As shown in FIG. 1, the connector 12 may be sized and shaped to fit within a ledge 81 of the battery 16. The connector may rest within the ledge 81 so that no portion of the connector extends above a top side of the battery. This can be helpful in reducing packaging and limiting space restrictions and help prevent rotation when mounting the connector 12. As also shown, the terminal adapter 20 may extend towards a corner 83 of the battery 16. This may be done to facilitate tightening of an adapter screw 85, which is slightly angled in an upright direction to further facilitate tightening. The screw 85 may be angled in any direction, both laterally and vertically and is not intended to be limited to the illustrated positions.

FIG. 8 illustrates the connector 12 having a stamped terminal adapter 20 in accordance with one non-limiting aspect of the present invention. The stamped terminal adapter 20 may be stamped from a single sheet of electrically conducting material into the illustrated configuration. The stamped terminal may be cheaper than the equivalent die-cast materials mainly because the manufacturing is simpler to automate and requires less material.

Figure 9:
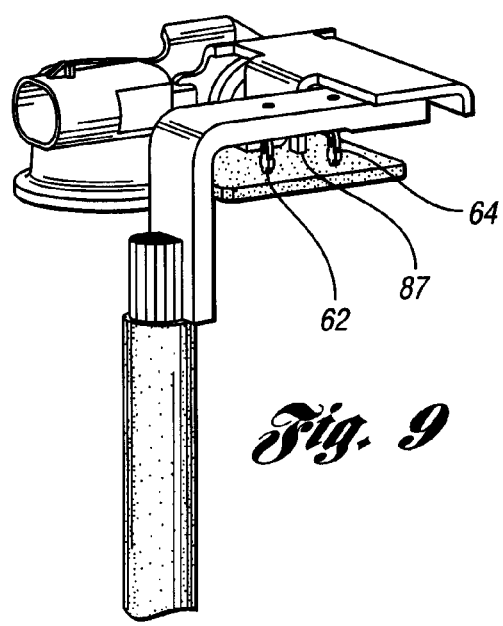

FIG. 9 illustrates the connector tabs 62-64 used to connect the shunt 40 to the PCB 80. The connector tabs 62-64 may be configured in the manner described above and/or as compliant type pins. The compliant pin configuration may rely on a press-fit between the shunt 40 and PCB 80 to establish an electrical connection for use in assessing battery operations. The compliant pins may also be configured to provide an electrical connecting without the mechanical connection produced with the press-fitting.

A leg 87 may be stamped into the adapter 20 for soldering to the PCB 80. This may be helpful in securing the PCB 80 to the adapter 20 and/or to facilitate thermally connecting a temperature element on the PCB 80 with the adapter 20. The leg 87 may include a shoulder (not show) or other feature with an extension extending therefrom. The extension may be sized and shaped to fit within or through the PCB 80 to facilitate locating and positioning the leg 87 with respect to the PCB 80.

Figure 10:
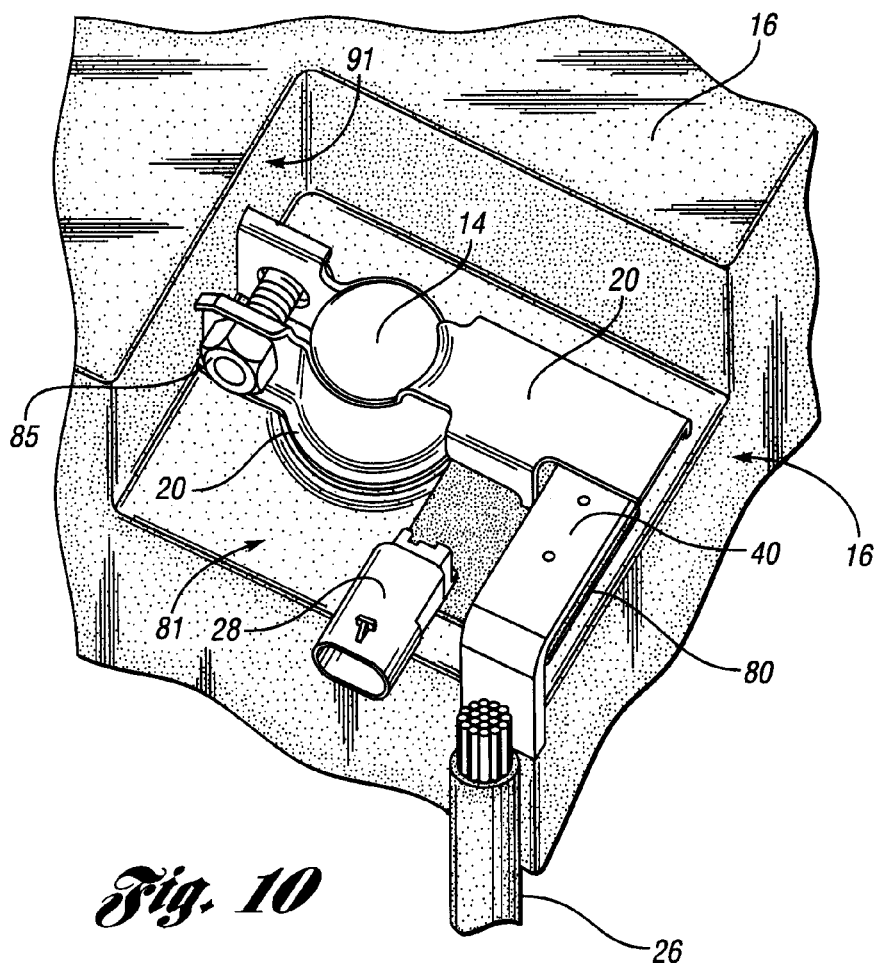

FIG. 10 illustrates the connector 12 having the stamped terminal 20 having the screw 85 on an opposite of the post 14 relative to the PCB 80. This arrangement may provide an easier way to tighten the screw 85 relative to the embodiment shown in FIG. 8 since the screw is in a more accessible position, i.e., it is not guarded by a wall 91 of the battery 16.

Figure 11:
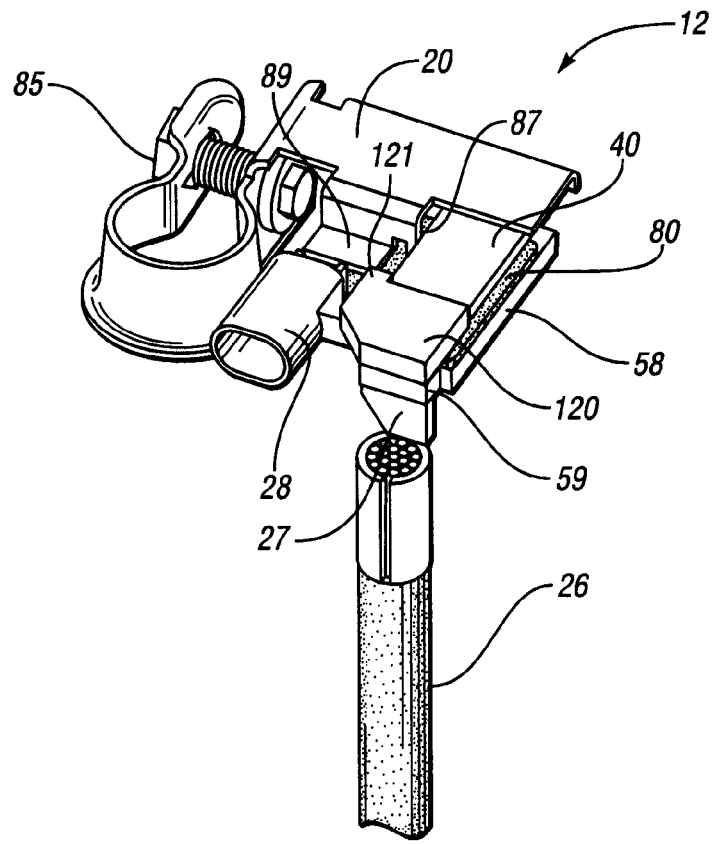
FIG. 11 illustrates a second stamped terminal in accordance with one non-limiting aspect of the present invention.

FIG. 11 illustrates the connector 12 having a second stamped terminal 120 in accordance with one non-limiting aspect of the present invention. The shunt 40 may be soldered at one end to the second stamped terminal 120 at the other end to the terminal adapter 20. The other end of the second stamped terminal 120 may be soldered to the cable 26 to provide an electrical connection between the battery post 14 and the cable 26. A flat portion 89 may be configured in a manner similar to the leg 87 to provide addition electrical or non-electrical connections and support between the adapter 20, 120 and the PCB 80.

A portion 121 of the stamped terminal 120 may be bent downward and soldered to the PCB 80. The portion 121 soldered to the PCB 80 may include a stopper or other feature to raise the shunt 40 above the PCB 80 so that the shunt 40 is electrically isolated therefrom. The terminal adapter 20 may be similar raised from the PCB 80, such as with the leg 87, to electrically isolate the other end of the shunt 40 from the PCB 80. The soldering at the leg 87, or elsewhere on the terminal adapter 20, and the soldering at the portion 121 may be used to provide electrical connections between the PCB 80 and both sides of the shunt 40 so that the shunt 40 can be used to assess a voltage drop.

Figure 12:
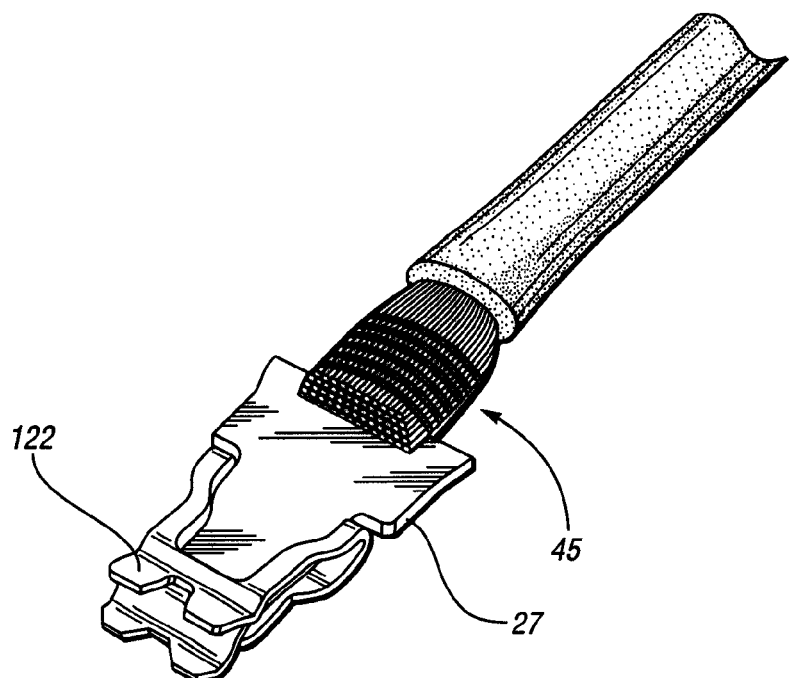
FIG. 12 illustrates a clip in accordance with one non-limiting aspect of the present invention.

The housing 58 may include a ring portion 59 connected to a lower bracket portion 27 a portion of the second stamped terminal 120. The ring portion 59 may be used to stabilize the cable 26 relative to the connector 12. FIG. 12 illustrates the bracket 27 having an optional clip 122 that may be included to facilitate attachment to the second stamped portion 120. The clip 122 may be removed in favor of soldering the wire portion 45 directly to the bracket portion 27. A similar type clip may also be used to attach the shunt 40 to the adapter 20 and stamped terminal 120. The wire portion 45 of the cable 26 may be soldered to the bracket 27 in a manner similar to that described above.

The shunt 40 described above in all embodiments of the present invention is shown to be a relatively planar shunt. The present invention fully contemplates the use of any type of shunt having any type of shape, including a shunt having a cylindrical shape. The present invention fully contemplates any number of connection methods to facilitate electrically connecting the terminals and PCB to the shunt and the use of any type of connector or soldering method to facilitate connecting to a cylindrical, planar, or other shaped shunt.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A battery monitoring system for use with a battery used to power electronic devices within a vehicle, the battery having a ledge proximate a battery post, the system comprising:
   a terminal adapter having a first compressively tightened connection at one end to electrically connect to the battery post and a second compressively tightened connection at another end to connect to a non-conducting portion of a cable, the cable being used to carry energy between the battery and the vehicle;
   a shunt attached at one end to the terminal adapter and at another end to a conducting portion of the cable;
   a battery monitoring circuit configured to measure a voltage drop between at least two separate portions of the shunt; and
   wherein the first compressively tightened connection at the one end and the second compressively tightened connection at the another end are sized and shaped to fit entirely within the ledge.

2. The system of claim 1 wherein the terminal adapter is more rigid than the cable.

3. The system of claim 1 wherein the second compressively tightened connection includes fingers that are compressed around an outside of a non-conducting portion of the cable.

4. The system of claim 1 further comprising s-shaped flexible connection pins soldered to the at least two separate portions of the shunt, the flexible connection pins providing a flexible electrical connection between the battery monitoring circuit and the shunt.

5. The system of claim 1 wherein the battery monitoring circuit is positioned below a portion of the terminal adapter extending between the one and the another ends, wherein the portion including a leg that extends down to support an offset between the battery monitoring circuit and the terminal adapter.

6. The system of claim 5 wherein the leg is soldered to the battery monitoring circuit and is one of the at least two separate portions used by the battery monitoring circuit to measure the voltage drop.

7. The system of claim 1 wherein a portion of the conducting portion that extends beyond the non-conducting portion is soldered to shunt.

8. The system of claim 1 wherein a portion of the conducting portion of the cable is bent at an angle relative to the non-conducting portion.

9. A battery monitoring system for use between a vehicle battery and a vehicle cable, the cable being used for transferring energy between the vehicle battery and one or more electronic devices included within a vehicle, the battery monitoring system comprising:
   a shunt having a first end connected to an electrically conducting portion of the cable;
   a terminal adapter composed of a continuous piece of material, the terminal adapter having:
      (i) a first cylindrically shaped, compressively tightened portion to electrically connect to a post of the battery;
      (ii) a second, shunt connecting portion at a first quadrant of the first portion, the second portion being electrically connected to the shunt; and
      (iii) a third, cable connecting portion proximate a boundary defined by a second and a third quadrant of the first portion, the third portion connecting to a non-conducting portion of the cable; and
   a battery monitoring circuit having first and second pins respectively connected to first and second points of the shunt, the battery monitoring circuit measuring a voltage drop between the pins.

10. The battery monitoring system of claim 9 wherein:
   the shunt is rectangular and extends lengthwise beyond both of the first and second quadrants of the first portion; and
   wherein an axis of the third portion corresponds with a center axis of the cable and is perpendicular to an axis of the second portion corresponding with a center axis of the post.

11. The battery monitoring system of claim 10 wherein the conducting portion of the cable is bent at an angle of approximately 90°.

12. The battery monitoring system of claim 11 wherein the non-conducting portion of the cable is not bent at the angle of approximately 90°.

13. The battery monitoring system of claim 10 wherein the cable extends beyond both of the second and third quadrants of the first portion.

14. The battery monitoring system of claim 13 wherein the cable and shunt are connected at an angle of approximately 90°.

15. The battery monitoring system of claim 9 wherein the first portion includes a tightening fastener extending from a fourth quadrant of the first portion such that the second portion, third portion, and tightening fastener each extend from different quadrants of the first portion, the tightening fastener being operable to tighten the first portion to the post of the battery.

16. A battery monitoring system for between a battery having a battery post and a cable used to carry energy exchanged with the battery, the battery monitoring system comprising:
   a shunt having a first end and a second end, the shunt extending lengthwise between the first and second ends;
   a first electrically conducting portion connected between the first end of the shunt and the battery post, the first electrically conducting portion having a fastener to attach to the battery post, the first electrically conducting portion including a first leg extending below a first main body portion, the first main body portion being generally rectangular and extending lengthwise beyond both sides of the first leg and both sides of the first end of the shunt;
   a second electrically conducting portion connected between the second end of the shunt and the cable, the second electrically conducting portion being separate from the first electrically conducting portion and including a second leg extending below a second main body portion, the second main body portion extending above and beyond both sides of the second end of the shunt; and
   a battery monitoring circuit in contact with both of the first and second legs, the battery monitoring circuit having electrical connections with the shunt at two separate locations, the battery monitoring circuit measuring a voltage drop between the two separate locations of the shunt.

17. The battery monitoring system of claim 16 wherein the first and second electrically conducting portions are separately stamped components.

18. The battery monitoring system of claim 16 wherein the first and second main body portions are even with a top side of the fastener, and wherein the battery includes a ledge proximate the battery post and the first and second electrically conducting portions are sized and shaped to fit entirely within the ledge.

19. The battery monitoring system of claim 16 further comprising a clip configured to removably attach the cable to the second electrically conducting portion, the clip being soldered to the cable.

20. The battery monitoring system of claim 16 wherein the first and second legs are the two separate locations used to electrically connect the battery monitoring circuit to the shunt.

* * * * *